United States Patent
Schulz et al.

(10) Patent No.: US 6,337,247 B1
(45) Date of Patent: Jan. 8, 2002

(54) METHOD OF PRODUCING A VERTICAL MOS TRANSISTOR

(75) Inventors: Thomas Schulz; Thomas Äugle; Wolfgang Rösner, all of München; Lothar Risch, Neubiberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/487,411

(22) Filed: Jan. 18, 2000

Related U.S. Application Data

(63) Continuation of application No. PCT/DE98/02000, filed on Jul. 16, 1998.

(30) Foreign Application Priority Data

Jul. 18, 1997 (DE) .......................................... 197 30 971

(51) Int. Cl.[7] ............................................ H01L 21/336

(52) U.S. Cl. ....................... 438/268; 438/158; 257/302; 326/119

(58) Field of Search ................................. 438/156, 163, 438/173, 209, 212, 268, 137, 138, 192, 197; 326/119; 257/66, 350, 329, 369, 302, 513

(56) References Cited

U.S. PATENT DOCUMENTS

| | | | |
|---|---|---|---|
| 4,648,937 A | | 3/1987 | Ogura et al. |
| 5,177,027 A | | 1/1993 | Lowrey et al. |
| 5,504,359 A | | 4/1996 | Rodder |
| 5,545,586 A | * | 8/1996 | Koh ............................ 437/89 |
| 5,723,370 A | * | 3/1998 | Ning et al. .................. 438/156 |
| 6,060,911 A | * | 5/2000 | Shulz et al. ................. 326/119 |

FOREIGN PATENT DOCUMENTS

| | | |
|---|---|---|
| DE | 4430483 A1 | 6/1995 |
| DE | 19621244 A1 | 11/1996 |
| DE | 19652801 C1 | 4/1998 |
| DE | 19652807 A1 | 6/1998 |
| EP | 0721221 A2 | 7/1996 |

OTHER PUBLICATIONS

"Vertical MOS Transistors with 70 nm Channel Length", Lothar Risch et al., IEEE Transactions on Electron Devices, vol. 43, No. 9, Sep. 1996, pp. 1495–1498.

"High Performance CMOS Surrounding Gate Transistor (SGT) for Ultra High Density LSIs", H. Takoto et al., IEDM 88, pp. 222–225.

"Vertical MOS Transistors with 70 nm Channel Length", L. Risch et al., Siemens AG, 1994, pp. 101–104.

(List continued on next page.)

Primary Examiner—Matthew Smith
(74) Attorney, Agent, or Firm—Herbert L. Lerner; Laurence A. Greenberg; Werner H. Stemer

(57) ABSTRACT

A spacer is used as a mask in an etching step during which a layer structure is produced for a channel layer and for a first source/drain region. After the layer structure has been produced, the first source/drain region and a second source/drain region can be produced by implantation. The second source/drain region is self-aligned on two mutually opposite flanks of the layer structure. A gate electrode can be produced in the form of a spacer on the two flanks. In order to avoid a capacitance formed by a first contact of the gate electrode and the first source/drain region, a part of the first source/drain region may be removed. If the layer structure is produced along edges of an inner area, then a third contact of the second source/drain region may be produced inside the inner area in order to reduce the surface area of the transistor.

15 Claims, 4 Drawing Sheets

OTHER PUBLICATIONS

"Channel and Source/Drain Engineering in High–Performance Sub–0.1 μm NMOSFETs Using X–Ray Lithography", Hang Lu et al., 1994 Sympositum on VLSI Technology Digest of Technical Papers, pp. 17–18.

"A 0.05 μm–CMOS with Ultra Shallow Source/Drain Junctions Fabricated by 5KeV Ion Implantation and Rapid Thermal Annealing", Atsushi Hori et al., 1994, IEEE, pp. 485–488.

"Process of the Future", Solid State Technology, Feb. 1995, pp. 42–53.

Friedrich Mader: "Technologie hochintegrierter Schaltungen" [technology of highly integrated circuits], Springer Verlag, Heidelberg, $2^{nd}$ ed., 1996, pp. 64–66.

* cited by examiner

METHOD OF PRODUCING A VERTICAL MOS TRANSISTOR

CROSS-REFERENCE TO RELATED APPLICATION

This is a continuation of copending International Application PCT/DE98/02000, filed Jul. 16, 1998, which designated the United States.

BACKGROUND OF THE INVENTION

FIELD OF THE INVENTION

The invention lies in the integrated technology field. More specifically, the invention relates to a vertical MOS transistor with a particularly small channel length and good radiofrequency and logic properties.

With a view to ever-faster components with higher integration density, the structure sizes of integrated circuits are decreasing from generation to generation. This holds equally true in the context of CMOS technology. It is generally expected (see, for example, Roadmap of Semiconductor Technology, Solid State Technology 3, (February 1995)) that MOS transistors with a gate length of less than 100 nm will be used by the year 2010.

Attempts have been made, on the one hand, to scale customary modern CMOS technology in order to develop planar MOS transistors with such gate lengths (see, for example, A. Hori, et al., "A 0.05 $\mu$m-CMOS with Ultra Shallow Source/Drain Junctions Fabricated by 5 keV Ion Implantation and Rapid Thermal Annealing," IEDM 1994, 485; and H. Hu, et al., "Channel and Source/Drain Engineering in High-Performance Sub-0.1 $\mu$m NMOSFETs Using X-Ray Lithography," Symposium on VLSI Technology, 17, 1994)). The production of such planar MOS transistors with channel lengths of less than 100 nm requires the use of electron beam lithography and has hitherto been possible only on a laboratory scale. The use of the electron beam lithography leads to a more than proportional increase in production costs.

In parallel with those efforts, vertical transistors are being investigated. Since the channel length extends vertically in relation to a surface of a substrate, the surface area of a vertical transistor can be smaller than that of conventional planar transistors. A further reduction in area is obtained by reducing the channel width required for a given current, by shortening the channel length. Risch et al., in "Vertical MOS Transistor with 70 nm Channel Length," ESSDERC 1995, pages 101–04, describe vertical MOS transistors with short channel lengths. In order to produce those vertical MOS transistors, layer sequences are formed corresponding to the source, channel and drain, and are annularly surrounded by the gate dielectric and gate electrode. The channel lengths of vertical MOS transistors are small compared with those of conventional planar transistors. In terms of their radiofrequency and logic properties, vertical MOS transistors have to date been unsatisfactory in comparison with planar MOS transistors. This is attributable, on the one hand, to parasitic capacitances of the overlapping gate electrode and, on the other hand, to the formation of a parasitic bipolar transistor in the vertical layer sequence.

H. Takato et al. IEDM 88, pages 222–25 describes a vertical MOS transistor whose gate electrode annularly surrounds a cuboid layer structure in which a first source/drain region and a channel layer are arranged. The annular arrangement of the gate electrode increases the space-charge zone, which leads to a reduction in the stray capacitance. The channel length of the MOS transistor is large and corresponds to that of conventional planar transistors. The layer structure is produced using a lithographic method, and preferably has a lateral width of about 1 $\mu$m, so that the space-charge zone fills the entire channel layer. The radiofrequency and logic properties of the vertical MOS transistor are therefore comparable with those of planar MOS transistors.

SUMMARY OF THE INVENTION

The object of the invention is to provide a method of producing a vertical MOS transistor which overcomes the above-noted deficiencies and disadvantages of the prior art devices and methods of this kind, and in which the radiofrequency and logic properties of the vertical MOS transistor are made comparable with those of planar MOS transistors, and the channel length of the vertical MOS transistor is made particularly small.

With the above and other objects in view there is provided, in accordance with the invention, a method of producing a vertical MOS transistor, which comprises:

providing a substrate of semiconductor material having a surface defining an axis extending perpendicularly to the surface;

forming a layer structure on the substrate with an etching process in which a spacer is used as a mask;

the layer structure having mutually opposite flanks extending parallel to the axis and including at least one first source/drain region and a channel layer below the first source/drain region relative to the axis;

forming a gate dielectric and a gate electrode at least in an area of the channel layer on the mutually opposite flanks of the layer structure; and forming a second source/drain region below the channel layer relative to the axis.

In other words, the vertical MOS transistor is formed with a first source/drain region and a channel layer as parts of a layer structure. At least in the area of the channel layer, the layer structure is provided on at least two sides, i.e. at least on two opposite flanks of the layer structure, with a gate dielectric and a gate electrode. A first part of the gate electrode, which is next to a first of the two opposite flanks, and a second part of the gate electrode, which is next to a second of the two opposite flanks, are connected to one another, e.g. via a contact or a web. The gate electrode may also be formed continuously. In contrast to a one-sided arrangement, with the two-sided arrangement the channel width is doubled, without the surface area of the vertical MOS transistor therefore being increased, and the current is thereby increased and the formation of space-charge zones between the two flanks in the channel layer is enhanced. This is advantageous since, in space-charge zones, no leakage currents are created owing to a parasitic bipolar transistor.

Space-charge zones become commensurately larger as the dopant concentration in the channel layer is reduced. However, since the intention is to produce a short channel length, the channel layer must be heavily doped in order to avoid leakage currents due to punch-through. In order to obtain a space-charge zone throughout the channel layer, a dimension between the two opposite flanks of the layer structure must accordingly be particularly small. To that end, the layer structure is produced with the aid of a spacer acting as a mask. The dimension between the two opposite flanks of the layer structure becomes so small that, when the gate electrode is driven appropriately, the vertical MOS transistor becomes fully depleted. With a conventional voltage of from 0V–2V, the dimension is about 30 nm to 90 nm.

A second source/drain region may be arranged as part of the layer structure under the channel layer. It is advantageous if the second source/drain region is not part of the layer structure, but is produced essentially laterally with respect to the layer structure. As a result of this, on the one hand, the heavily doped first source/drain region and the heavily doped second source/drain region can be produced in self-aligned fashion by implantation, i.e. without using masks to be aligned. The first source/drain region is in this case arranged over the channel layer. On the other hand, the channel layer can be connected to a substrate of semiconductor material, which prevents floating-body effects in the channel layer should the latter not be fully depleted. In this case, the substrate is doped with the conductivity type of the channel layer in a layer next to the channel layer. The conductivity type of the layer may, however, also be chosen independently of the conductivity type of the channel layer. The conductivity type of the first source/drain region and of the second source/drain region can be swapped with the conductivity type of the channel layer.

The second source-drain region may also be formed as part of the layer structure, and/or adjoin the channel layer from below.

It is within the scope of the invention to produce the layer structure by structuring a layer sequence. For the layer sequence, at least one first layer doped with a second conductivity type is produced for the channel layer, and a second layer doped with a first conductivity type, which is the opposite of the second conductivity type, is produced for the first source/drain region. If the vertical MOS transistor is intended to be integrated in a circuit arrangement having a plurality of components, then it may be favorable to produce extra layers for the layer sequence.

The layer sequence can be produced over the entire surface of the substrate by epitaxial growth of in-situ doped semiconductor material. It is also possible to produce an indentation in the substrate, in which the layer sequence is produced by epitaxial growth. It is also possible, on the surface, to deposit a material in which an indentation extending as far as the surface is produced, and to produce the layer sequence by epitaxial growth in this indentation. If the layer sequence is grown epitaxially in an indentation, facets are formed at edges of the indentation since, at these edges, the growth rate is slower with selective epitaxy. The layers therefore become particularly thin, which leads to an especially small channel length. The layer sequence can also be produced by implantation with, in each case, differently charged ions and different ranges. In this case, epitaxial growth is not necessary and the substrate can be structured in order to produce the layer sequence. The layer sequence may contain a silicon layer and/or an $Si_{(1-x)}Ge_x$ layer.

In accordance with an added feature of the invention, therefore, the spacer is formed by:
  producing a first auxiliary layer and structuring the first auxiliary layer with the aid of a first mask in such a way as to form an edge; and
  subsequently producing a second auxiliary layer and etching the second auxiliary layer back to create the spacer from the second auxiliary layer, next to the edge of the first auxiliary layer.

In accordance with an additional feature of the invention, the step of forming the layer structure comprises structuring a layer sequence and forming a first layer doped with a second conductivity type for the channel layer and forming a second layer doped with a first conductivity type, which is the opposite of the second conductivity type, for the first source/drain region.

In accordance with another feature of the invention, wherein the first layer and then the second layer are epitaxially grown surface-wide above the surface, and the first auxiliary layer is subsequently produced above the second layer in relation to the axis.

It should be understood that expressions such as "a is above b" or "a is below b" does not necessarily mean that the two members or features are directly adjacent one another. Additional structure, i.e., something else, may be arranged between a and b.

In order to produce the spacer, it is advantageous to form an edge along which the spacer is created by depositing material and etching it back. The edge can be produced by depositing and structuring a first auxiliary layer above the layer sequence. The edge can also be created by masked etching of the layer sequence.

The layer structure may be formed in web form. It is within the scope of the invention if the layer structure is formed along a dividing line of a square or circular inner area of the substrate. To that end, the edge may be formed in such a way that one surface of the inner area lies deeper than its surroundings or higher than its surroundings. It is within the scope of the invention to form the layer structure along a complicated line pattern, e.g. the dividing lines of a rectangle together with web-like extensions on the sides of the rectangle.

It is advantageous to form the gate electrode as a spacer, so that the gate electrode becomes small and can be produced in self-aligned fashion.

In order to make contact with the gate electrode, it is advantageous to remove a part of the second layer in one area of the layer structure. In this area, contact is then made with the gate electrode using a first contact. Since the part of the second layer has been removed in this area, the formation of an undesired capacitance between the gate electrode and the first source/drain region is prevented. For the case in which the layer structure is formed along the dividing line of the inner area, a part of the gate electrode in the inner area is electrically connected with a part of the gate electrode outside the inner area by means of this contact. The gate electrode is formed continuously.

In order to form the gate electrode continuously, instead of this, a part of the layer structure may be removed so that the layer structure does not fully enclose the inner area. By depositing and etching back polysilicon, the gate electrode is thereby formed continuously.

As an alternative, the part of the gate electrode in the inner area and the part of the gate electrode outside the inner area may be connected by producing a conductive structure that adjoins, in a U-shape, the two opposite flanks and a surface of the layer structure which is at right angles in relation to the two opposite flanks. In order to prevent formation of the undesired capacitance between the gate electrode and the first source/drain region, it is advantageous in this case not to remove the spaces in one area, to produce extra spacers which cover the flanks of the layer structure and to produce the U-shaped conductive structure in this area. As a result, the distance between the U-shaped conductive structure and the first source/drain region is made large and the associated capacitance is made small. The U-shaped conductive structure can be produced at the same time as the gate electrode by depositing material and, with the aid of a mask which covers the area, etching it until the gate electrode is created in the form of a spacer. An unetched part of the material forms the U-shaped conductive structure.

In order to reduce the area of the vertical MOS transistor, it is advantageous to arrange a third contact of the second source/drain region inside the inner area. To that end, the second source/drain region is formed in such a way that a first part of the second source/drain region coincides with the inner area. After the gate electrode has been produced insulating material is deposited and etched back, by means of which a first insulating structure is created in the form of spacers that cover the gate electrode. The first part of the second source/drain region in the inner area is in this case partially exposed. A third contact is formed on the first part of the second source/drain region by depositing and etching back conductive material. At the same time, a second contact which makes contact with the first source/drain region is also formed.

Before making contact with the second source/drain region and the first source/drain region, it is advantageous to deposit and silicize metal.

A metal silicide contact structure created in this case reduces the electrical resistance at the junction between the respective source/drain region and the associated contact.

In order to simplify the production process, it is advantageous to use different insulating materials for insulating structures and for a protective layer which are next to one another, so that etching steps can be carried out selectively.

In order to make better contact with the first source/drain region, it is advantageous to produce the layer structure in such a way that it is particularly wide in one area. To that end, a mask covers this area when the spacer is being produced.

It is advantageous to produce a protective layer over the second source/drain region in order to reduce the capacitance formed by the gate electrode and the second source/drain region.

Other features which are considered as characteristic for the invention are set forth in the appended claims.

Although the invention is illustrated and described herein as embodied in a method for producing a vertical MOS transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
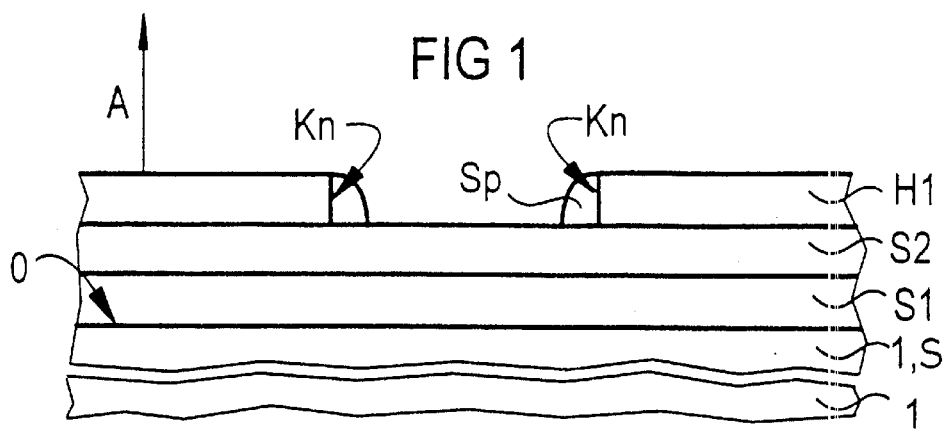
FIG. 1 is a partial section through a first substrate on a surface of which a first layer and a second layer have been epitaxially grown, after a first auxiliary layer has been structured on a surface of the second layer and a spacer has been produced from a second auxiliary layer.

It should be understood that the figures of the drawing are not to scale.

DESCRIPTION OF THE PREFERRED EMBODIMENTS

Referring now to the figures of the drawing in detail and first, particularly, to FIG. 1 thereof, there is seen a first exemplary embodiment with a first substrate 1 made of silicon and with an approximately 400 $\mu$m thick n-doped layer S adjoining a surface O of the first substrate 1. The dopant concentration is about $10^{15} cm^{-3}$. An n-doped first layer S1 grown by epitaxy on the surface O of the substrate 1 surface-wide as part of a layer sequence. The dopant concentration of the first layer S1 is about $10^{18} cm^{-3}$. Over the first layer S1, a p-doped second layer S2 is then grown by epitaxy as part of the layer sequence. The dopant concentration of the second layer S2 is about $5*10^{19} cm^3$. Over the second layer S2 there is deposited a first auxiliary layer H1 of $SiO_2$ with a thickness of about 200 nm. With the aid of a first mask of photoresist, which does not cover a rectangular inner area of a surface of the first auxiliary layer H1, the first auxiliary layer H1 is structured in such a way that a part of a surface of the second layer S2 is exposed. For example, $CHF_3/O_2$ is suitable as the etchant. At edges of the inner area, an edge Kn is thereby formed. A non-illustrated second auxiliary layer of silicon nitride is then deposited with a thickness of about 70 nm and etched back so as to form a spacer Sp at the edge Kn. Next, $SiO_2$ is firstly wet-etched selectively with respect to silicon nitride using, for example, $NH_4F/HF$, and then silicon is anisotropically etched using, for example, $HBr/NF_3/O_2/He$, until the surface, O is exposed. Since the spacer Sp has a width of about 70 nm, an approximately 70 nm wide layer structure St is thereby created from the layer sequence along the edges of the inner area (see FIG. 2).

With the aid of hot phosphoric acid as etchant, the spacer Sp is then removed. With the aid of a second mask made of photoresist, which does not cover a first corner of the inner area, a part of the second layer S2 of the layer structure St is removed.

Figure 2:
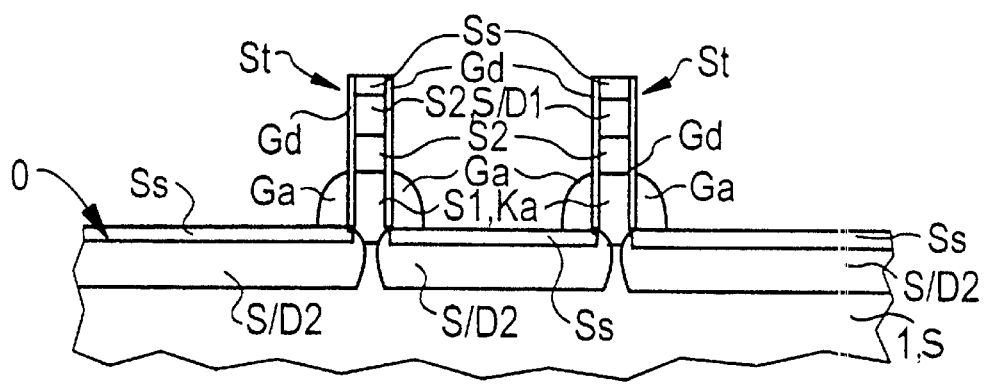
FIG. 2 is the partial section of FIG. 1, after a layer structure, a first source/drain region, a second source/drain region, a protective layer, a gate dielectric, a gate electrode; and first contact have been produced.

A p-doped first source/drain region S/D1 is then produced by implantation in the structured second layer S2, and, below the surface O, a p-doped second source/drain region S/D2 (see FIG. 2). The dopant concentration is about $10^{21} cm^{-3}$. The second source/drain region S/D2 is thereby formed in self-aligned fashion next to the layer structure St. The structured first layer S1 is suitable as a channel layer Ka.

The channel layer Ka adjoins the layer S, by means of which floating-body effects in the channel layer Ka are prevented.

$SiO_2$ is then applied anisotropically with a thickness of about 250 nm, by means of which surfaces perpendicular to an axis A extending perpendicular to the surface O are covered more thickly with $SiO_2$ than surfaces parallel to the axis A (see FIG. 1). $SiO_2$ is then etched isotropically using, for example $NH_4F/HF$ until the $SiO_2$ has been removed from the parallel surfaces. The $SiO_2$ on the perpendicular surfaces forms a protective layer Ss (see FIG. 2).

A gate dielectric Gd is then produced by thermal oxidation.

In-situ doped polysilicon is then deposited with a thickness of about 100 nm and etched, with the aid of a third mask made of photoresist which covers the first corner of the inner area, so that a gate electrode Ga in the form of spacers is created on the opposite flanks of the layer structure St (see FIG. 2) and, at the first corner of the inner area, a first contact is created which makes contact with the gate electrode Ga and electrically connects a first part of the gate electrode Ga, which is arranged in the inner area, and a second part of the gate electrode Ga, which is arranged outside the inner area, to one another. The protective layer Ss reduces the capacitance which is formed by the gate electrode Ga and the second source/drain region S/D2.

Figure 3:
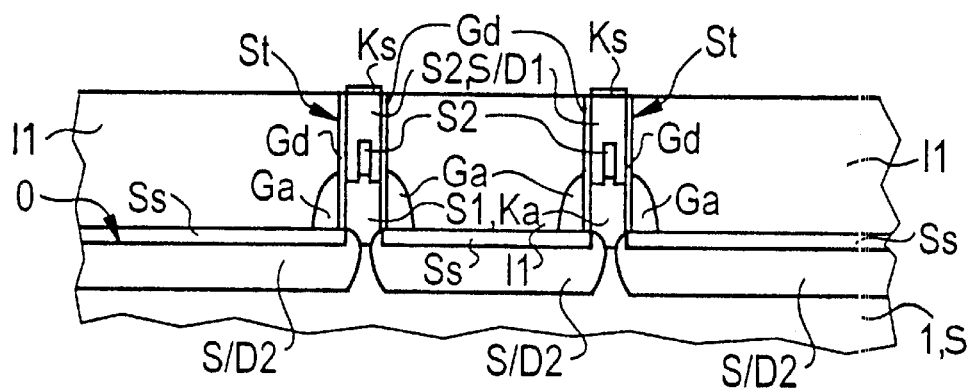
FIG. 3 is the partial section of FIG. 2, after the first source/drain region has been widened by oblique implantation and a first insulating structure and a contact structure have been produced.

By oblique implantation, the first source/drain region S/D1 is widened until it adjoins the gate electrode Ga (see FIG. 3). The gate electrode Ga is used as a mask in this case.

$SiO_2$ is then deposited with a thickness of about 200 nm and etched back until the first source/drain region S/D1 is exposed. This creates a first insulating structure I1, which is illustrated in FIG. 3. The protective layer Ss is in this case partially removed.

In order to produce a contact structure Ks, titanium is deposited and selectively silicized. The titanium remaining is removed by using, for example, $NH_4OH/H_2O_2$ (see FIG. 3).

Aluminum is then deposited with a thickness of about 500 nm and structured with the aid of a fourth mask made of photoresist. This creates a second contact which makes contact with the first source/drain region S/D1.

Contact is made with the second source/drain region S/D2, in accordance with the prior art, outside the inner area.

Figure 4:
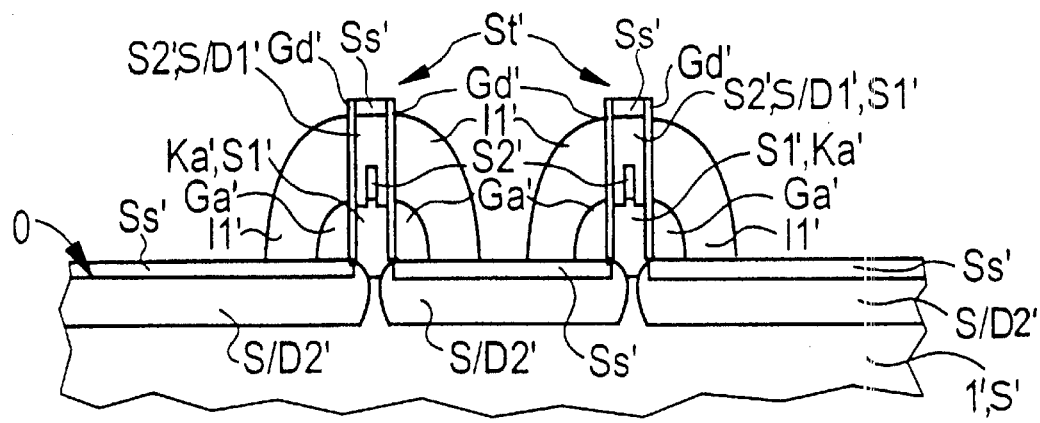
FIG. 4 is a partial section through a second substrate (taken along the line IV—IV in FIG. 6), after a layer structure, a first source/drain region, a second source/drain region, a protective layer, a gate dielectric, a gate electrode, a first contact, and a first insulating structure have been produced.
Figure 5:
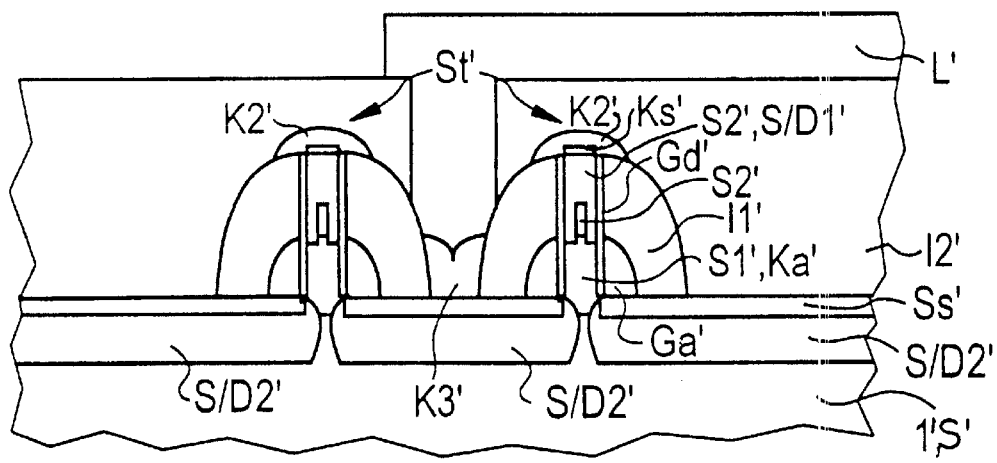
FIG. 5 is the same section as in FIG. 4, taken along the line IV—IV in FIG. 6, after contact structures, a second contact, a third contact, and a second insulating structure have been produced.
Figure 6:
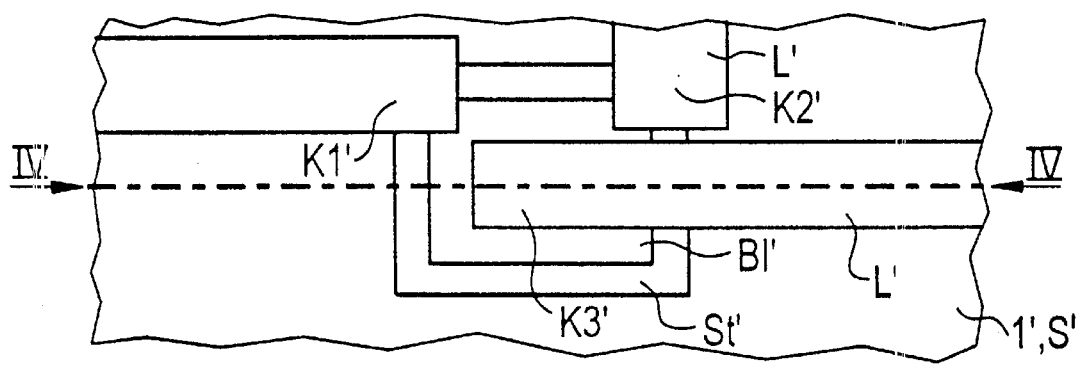
FIG. 6 is a detail of a plan view onto the structure illustrated in FIG. 5.

Referring now to FIGS. 4, 5, and 6, in a second exemplary embodiment, a second substrate 1' made of silicon is p-doped in an approximately 400 μm thick layer S' adjoining a surface O' of the second substrate 1'. In the same way as in the first exemplary embodiment, a layer structure St along edges of an inner area BI' (FIG. 6), a first source/drain region S/D1', a second source/drain region S/D2', a protective layer Ss', a gate dielectric Gd', a gate electrode Ga' and, at a first corner of the layer structure St', a first contact K1' are produced. Silicon nitride is then deposited with a thickness of about 170 nm and, with the aid of a fourth mask made of photoresist which covers the first corner of the layer structure St', etched so that the gate electrode Ga' is covered by a first insulating structure I1' in the form of a spacer made of silicon nitride (see FIG. 4). By etching $SiO_2$ selectively with respect to silicon nitride using, for example, $HF/HNO_3$, the protective layer Ss' is partially removed so that a part of the second source/drain region S/D2' in the inner area BI' as well as the first source/drain region S/D1' are exposed (see FIG. 5).

In order to produce contact structures Ks', titanium is deposited and silicized selectively. The remaining titanium is removed with, for example, $NH_4OH/H_2O_2$ (see FIG. 5).

In order to make contact with the first source/drain region S/D1' and the second source/drain region S/D2', in-situ doped polysilicon is deposited and—with the aid of a fifth mask made of photoresist which overlaps the layer structure St'—it is etched until a part of the doped polysilicon that adjoins the second source/drain region S/D2' and serves as a third contact K3', is no longer connected to the remaining doped polysilicon above the first source/drain region S/D1', which serves as a second contact K2' (see FIG. 5). In order to produce a second insulating structure I2', $SiO_2$ is then deposited with a thickness of about 200 nm and, with the aid of a sixth mask made of photoresist which does not cover a part of the inner area BI' and does not cover a second corner of the layer structure St', etched so that the second contact K2' and the third contact K3' are exposed. By depositing and structuring aluminum, conductive structures L' are produced which are respectively connected to the second contact K2' or the third contact K3' (see FIGS. 5 and 6).

In a third exemplary embodiment, a third substrate 1" made of silicon is n-doped in an approximately 400 μm thick layer S" adjoining a surface O" of the third substrate 1". With the aid of a mask which does not cover a T-shaped area, an n-doped approximately 200 nm deep second source/drain region S/D2" of a transistor is produced by implantation. The dopant concentration of the second source/drain region S/D2" is about $10^{21} cm^{-3}$ (see FIG. 7). The transistor is formed inside the T-shaped area.

Figure 8:
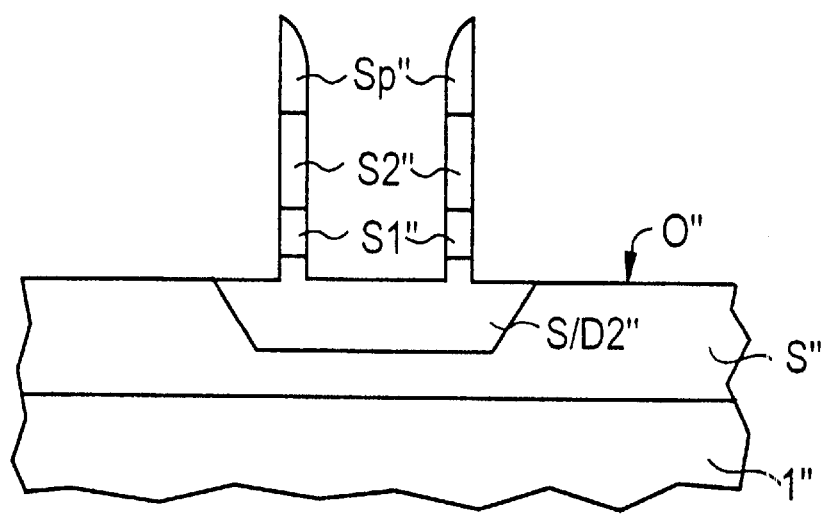
FIG. 8 is a partial section through the third substrate after a second source/drain region, a first layer, a second layer, a spacer, and a layer structure have been produced.
Figure 9:
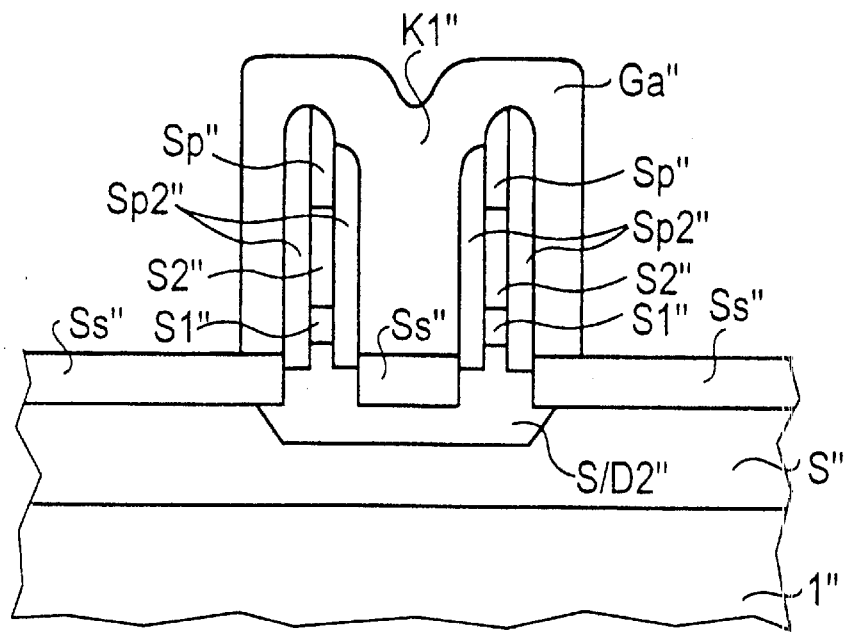
FIG. 9 is the same section as in FIG. 8, after second spacers, a protective layer, a gate dielectric (not shown in FIG. 9), and a gate electrode have been produced.
Figure 10:
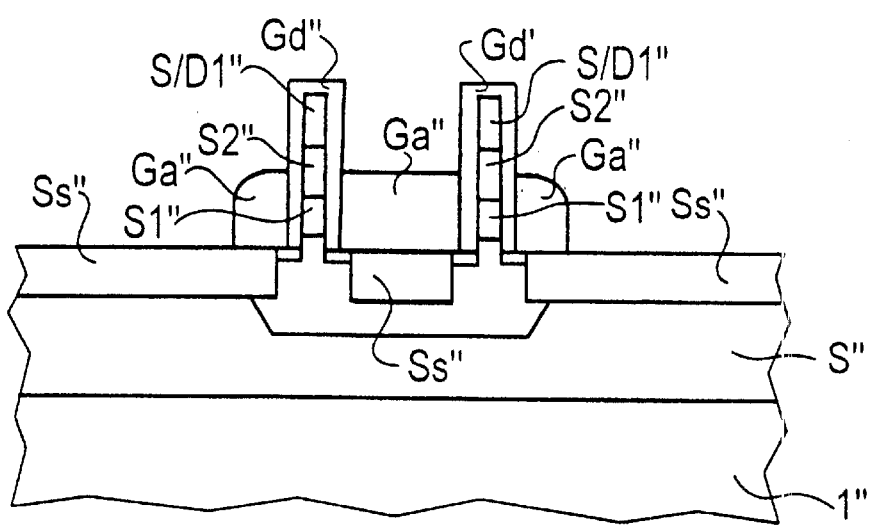
FIG. 10 is a further section taken parallel to the section of FIG. 9.

A p-doped approximately 100 nm thick first layer S1" is then grown by epitaxy surface-wide as part of a layer sequence. The dopant concentration of the first layer S1" is about $10^{18} cm^{-3}$. Over the first layer S1" an approximately 200 nm thick ndoped second layer S2" is grown by epitaxy as part of the layer sequence. The dopant concentration is about $5*10^{19} cm^{31\ 3}$. Next, as in the first exemplary embodiment, a layer structure St" is produced along edges of an inner area BI" with the aid of a spacer Sp" (see FIG. 8). Silicon nitride is then deposited to a thickness of about 50 nm and etched back so that second spacers Sp2" are created at edges of the layer structure St" (see FIG. 9). An approximately 100 nm thick protective layer Ss" is then produced by thermal oxidation (see FIG. 9). With the aid of a second mask, which covers a first area B1" of the layer structure St", silicon nitride is etched using, for example $O_2/SF_6$, by means of which the second spacers Sp2" are partially removed (see FIGS. 7 and 10).

A gate dielectric Gd" is then produced by thermal oxidation. Next, polysilicon is deposited with a thickness of about 100 nm and, with the aid of a mask made of photoresist which covers the first area B1", etched so that a gate electrode Ga" is created in the form of spacers at the flanks of the layer structure St" (see FIG. 10) and, in the first area B1", a first contact K1" is created (see FIG. 7) which makes contact with the gate electrode Ga" and electrically connects a first part of the gate electrode Ga", which is arranged in the inner area BI", and a second part of the gate electrode Ga", which is arranged outside the inner area BI", to one another. The protective layer Ss" reduces the capacitance formed by the gate electrode Ga" and the second source/drain region S/D2". The second spacers Sp2" reduce the capacitance formed by the first contact K1" and the first source/drain region S/D1" to be produced.

Next, by implantation, the first source/drain region S/D1" is produced in the second layer S2" and the gate electrode Ga" is doped. The dopant concentration is about $10^{21} cm^{-3}$ (see FIG. 10).

Figure 7:
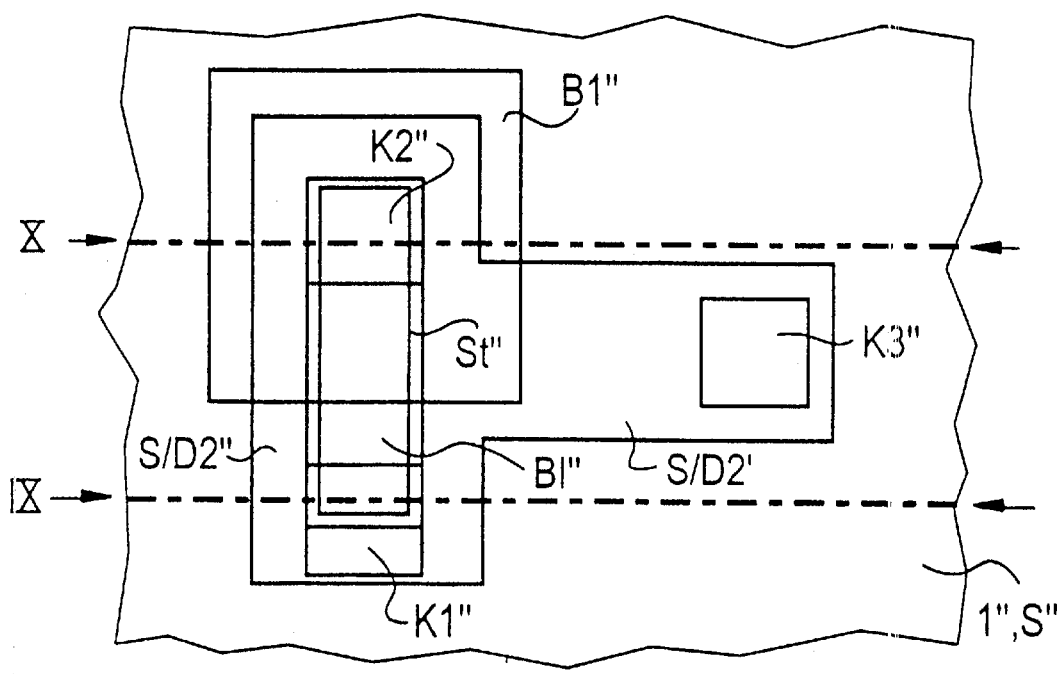
FIG. 7 is a detail of a plan view onto a third substrate which comprises a transistor, where a second source/drain region, a layer structure, a first contact, a second contact, a third contact, an inner area, and a first area are shown.

Next, as in the first exemplary embodiment, a first insulating structure, a contact structure, a second contact K2" for the first source/drain region S/D1" and a third contact K3" for the second source/drain region S/D2" are produced (see FIG. 7).

As in the second exemplary embodiment, contact may also alternatively be made with the second source/drain region inside the inner area.

In order to make reliable contact with the first source/drain region, when the spacers are being produced it is possible to use a mask which covers an area in which the second contact is produced. In this area, the layer structure is wider than 70 nm and is therefore easier to make contact with.

It will be understood that the above embodiment are only exemplary and that the general concept of the invention lends itself to many variations, which also fall within the scope of the invention. In particular, the dimensions of the layers, regions, areas and structures which have been described may be tailored to the particular requirements. The same is also true of the proposed dopant concentrations. Structures and layers made of $SiO_2$ can, in particular, be produced by thermal oxidation or by a deposition process. Insulating structures and the protective layer may also be made of other insulating materials. Polysilicon may be doped both during and after the deposition. Instead of doped polysilicon, it is also possible to use, for example, metal silicides and/or metals. Instead of producing the first insulating structure by etching back, the material of which the insulating structure is made may be eroded by chemical-mechanical polishing and, in the case in which the third contact is intended to be produced in the inner area, etched with the aid of a mask.

We claim:

1. A method of producing a vertical MOS transistor, which comprises:
    providing a substrate of semiconductor material having a surface defining an axis extending perpendicularly to the surface;
    forming a layer structure on the substrate with an etching process in which a spacer is used as a mask;
    the layer structure having mutually opposite flanks extending parallel to the axis and including at least one first source/drain region and a channel layer below the first source/drain region relative to the axis;
    forming a gate dielectric and a gate electrode at least in an area of the channel layer on the mutually opposite flanks of the layer structure; and
    forming a second source/drain region below the channel layer relative to the axis.

2. The method according to claim 1, which comprises forming the spacer by:
    producing a first auxiliary layer and structuring the first auxiliary layer with the aid of a first mask in such a way as to form an edge; and
    subsequently producing a second auxiliary layer and etching the second auxiliary layer back to create the spacer from the second auxiliary layer, next to the edge of the first auxiliary layer.

3. The method according to claim 1, wherein the step of forming the layer structure comprises structuring a layer sequence and forming a first layer doped with a second conductivity type for the channel layer and forming a second layer doped with a first conductivity type, which is the opposite of the second conductivity type, for the first source/drain region.

4. The method according to claim 3, which comprises epitaxially growing the first layer and then the second layer surface-wide above the surface, and subsequently producing the first auxiliary layer above the second layer in relation to the axis.

5. The method according to claim 1, which comprises forming one of the first source/drain region and the second source/drain region in self-aligned fashion by implantation after the layer structure has been produced.

6. The method according to claim 1, which comprises producing the gate electrode by oblique implantation, and subsequently widening the first source/drain region to adjoin the gate electrode, with the gate electrode acting as a mask.

7. The method according to claim 1, which comprises, subsequently to producing the gate dielectric, depositing and etching material for creating the gate electrode as a spacer along all flanks of the layer structure.

8. The method according to claim 1, which comprises:
    partially etching a part of the layer structure to remove the first source/drain region in that part; and
    forming a first contact with the gate electrode at that part of the layer structure.

9. The method according to claim 1, which comprises forming the layer structure as a web.

10. The method according to claim 1, wherein the substrate has a substantially square inner area and the layer structure is formed at least as a part of a dividing line defining the substantially square inner area.

11. The method according to claim 1, wherein the substrate has a substantially circular inner area and the layer structure is formed at least as a part of a dividing line defining the substantially circular inner area.

12. The method according to claim 1, wherein the substrate has an inner area and the layer structure is formed as a web defining at least a part of a dividing line defining the inner area.

13. The method according to claim 1, which comprises, after the step of forming the gate electrode, producing a first insulating structure by depositing and eroding insulating material until the first source/drain region is exposed, and depositing conductive material to make contact with the first source/drain region.

14. The method according to claim 13, which comprises:
    after the step of forming the gate electrode, producing a first insulating structure by depositing and etching back insulating material to create spacers covering the gate electrode and to expose a part of the second source/drain region inside an inner area of the substrate;
    making contact with the first source/drain region and making contact with the second source/drain region, by depositing conductive material and etching the conductive material with a mask until the first source/drain region and the second source/drain region are no longer electrically connected to one another;
    depositing insulating material to insulate the first source/drain region from the second source/drain region; and
    making contact with the second source/drain region by etching the insulating material with a mask until a part of the conductive material adjacent the second source/drain region is exposed, and subsequently depositing conductive material.

15. The method according to claim 1, wherein
    the channel layer is formed adjoining a layer, doped with a second conductivity type, of the substrate; and
    the step of forming the second source/drain region comprises forming the second source/drain region substantially laterally with respect to the channel layer and below the gate electrode in relation to the axis.

* * * * *